(12) United States Patent
LeSage et al.

(10) Patent No.: US 6,879,214 B2
(45) Date of Patent: Apr. 12, 2005

(54) BIAS CIRCUIT WITH CONTROLLED TEMPERATURE DEPENDENCE

(75) Inventors: Steven R. LeSage, Hillsboro, OR (US); Stephen P. Bachhuber, Blacksburg, VA (US); Thomas R. Apel, Portland, OR (US)

(73) Assignee: Triquint Semiconductor, Inc., Hillsboro, OR (US)

( * ) Notice: Subject to any disclaimer, the term of this patent is extended or adjusted under 35 U.S.C. 154(b) by 0 days.

(21) Appl. No.: 10/421,679

(22) Filed: Apr. 22, 2003

(65) Prior Publication Data

US 2004/0056721 A1 Mar. 25, 2004

Related U.S. Application Data

(60) Provisional application No. 60/412,342, filed on Sep. 20, 2002.

(51) Int. Cl.[7] .................................................. H03F 3/04
(52) U.S. Cl. ...................................... 330/289; 330/296
(58) Field of Search .................................. 330/289, 296

(56) References Cited

U.S. PATENT DOCUMENTS

| | | | | | |
|---|---|---|---|---|---|
| 4,251,778 | A | * | 2/1981 | Ahmed | 330/279 |
| 5,394,112 | A | * | 2/1995 | Alini et al. | 330/256 |
| 5,654,665 | A | * | 8/1997 | Menon et al. | 327/541 |
| 6,091,286 | A | * | 7/2000 | Blauschild | 327/543 |
| 6,452,454 | B1 | * | 9/2002 | Shapiro et al. | 330/289 |

* cited by examiner

*Primary Examiner*—Patricia Nguyen
(74) *Attorney, Agent, or Firm*—Bever Hoffman & Harms, LLP

(57) ABSTRACT

A bias control circuit generates a bias control current that is proportional to temperature. The bias control current is drawn from a first node of a bias circuit. The first node of the bias circuit is also configured to receive a relatively large first current that is also proportional to temperature. A bias current is also drawn from the first node, wherein the bias current is equal to the difference between the relatively large first current and the bias control current. The temperature sensitivities of the bias control current and the relatively large first current are matched, such that the bias control current is relatively insensitive to changes in temperature.

15 Claims, 3 Drawing Sheets

BIAS CIRCUIT WITH CONTROLLED TEMPERATURE DEPENDENCE

RELATED APPLICATIONS

The present invention is a continuation-in-part of Provisional U.S. Patent Application Ser. No. 60/412,342, which was filed on Sep. 20, 2002.

BACKGROUND

1. Field of the Invention

The present invention relates to a bias circuit that operates relatively independent of operating temperature. More specifically, the present invention relates to a bias circuit for biasing a transmitter amplifier stage, wherein the biasing is substantially independent of the operating temperature.

2. Related Art

FIG. 1 is a block diagram of a portion of a conventional transmitter power amplifier circuit 100. Transmitter power amplifier circuit 100 is typically used in a cellular telephone handset. Transmitter power amplifier circuit 100 is used to amplify a radio frequency signal for transmission from the handset to a nearby receiving station. Transmitter power amplifier circuit 100 includes a bias circuit 101 and a transmitter amplifier stage 102. Bias circuit 101 is described in more detail in U.S. Pat. No. 6,441,687.

Bias circuit 101 includes diode element 110, resistors 111–113, NPN bipolar transistors 121–122, and nodes 104–105, which are connected as illustrated. Transmitter stage 102 includes resistors $130_1$–$130_N$ and NPN bipolar transistors $131_1$–$131_N$, which are connected as illustrated.

In general, transistor 121 operates as a reference device. Bias circuit 101 causes a collector current $I_3$ to flow through transistor 121. This collector current $I_3$ is reflected to transistors $131_1$–$131_N$, thereby causing corresponding collector currents $I_{C1}$, $I_{C2}$, ... $I_{CN}$ to flow through these transistors $131_1$–$131_N$. A DC voltage (not shown) is applied to the collectors of transistors $131_1$–$131_N$. Resistor 111 provides most of the current flowing through transistor 121. However, some of the current through transistor 121 is supplied by resistor 112 and diode 110. Resistor 112 and diode 110 form a level-shifter, which provides a voltage to the base of transistor 122. Transistor 122 operates as an emitter-follower to supply base current to transistors 121 and $131_1$–$131_N$. The voltage at the emitter of transistor 122 is provided to the base of transistor 121 through resistor 113, thereby completing a feedback loop that sets the operating point of bias circuit 101.

More specifically, bias circuit 101 operates in the following manner. A supply voltage $V_{CC}$ (e.g., 3.3 Volts) is applied to the collector of transistor 122, and a reference voltage $V_{REF}$ is applied to resistors 111 and 112. The reference voltage $V_{REF}$ is typically a regulated voltage (e.g., 2.8 V±0.1 V) received from a constant voltage source (not shown), such as a band-gap referenced voltage regulator.

The voltage ($V_{112}$) across resistor 112 is defined as follows:

$$V_{112} = V_{REF} - (V_{BE1} + V_{BE2}) \quad (1)$$

where $V_{BE1}$ is equal to the base-to-emitter voltage of transistor 121, and $V_{BE2}$ is equal to the base-to-emitter voltage of transistor 122.

Resistor 112 has a resistance of $R_2$. The current ($I_2$) flowing through resistor 112 is therefore defined as follows:

$$I_2 = V_{112}/R_2 = (V_{REF} - (V_{BE1} + V_{BE2}))/R_2 \quad (2)$$

Because resistor 111 is connected in parallel with resistor 112 and diode 110, the voltage across resistor 111 ($V_{111}$) is equal to the voltage across resistor 112 ($V_{112}$) plus the voltage across diode 110 ($V_{D1}$). Resistor 111 has a resistance of $R_1$. The current ($I_1$) flowing through resistor 111 can therefore be defined as follows:

$$I_1 = V_{111}/R_1 \quad (3)$$

$$I_1 = (V_{112} + V_{D1})/R_1 \quad (4)$$

$$I_1 = (V_{REF} - (V_{BE1} + V_{BE2}) + V_{D1})/R_1 \quad (5)$$

Assuming that the base current of transistor 122 is negligible, the collector current ($I_3$) flowing through transistor 121 is equal to $I_1 + I_2$. Thus, the collector current $I_3$ can be defined as follows.

$$I_3 = (V_{REF} - (V_{BE1} + V_{BE2}))/R_2 + (V_{REF} - (V_{BE1} + V_{BE2}) + V_{D1})/R_1 \quad (6)$$

The bases of transistors 121 and $131_1$–$131_N$ are all biased by the voltage ($V_{BIAS}$) on node 105. Thus, the collector current $I_3$ of transistor 121 is proportional to the collector currents $I_{C1}$–$I_{CN}$ of transistors $131_1$–$131_N$. In this manner, bias circuit 101 selects the collector (DC bias) currents in the transistors $131_1$–$131_N$ of transmitter stage 102.

The bases of transistors $131_1$–$131_N$ are also connected to receive radio frequency (RF) input signals $IN_1$–$IN_N$, respectively. Transistors $131_1$–$131_N$ provide amplified RF output signals $OUT_1$–$OUT_N$ in response to the input signals $IN_1$–$IN_N$ and the bias voltage ($V_{BIAS}$) on node 105.

It is desirable for the collector currents in transistors $131_1$–$131_N$ to be constant with respect to varying temperature. Variations in these collector currents undesirably result in variations in the power of the output signals $OUT_1$–$OUT_N$. In order for the collector currents $I_{C1}$–$I_{CN}$ of transistors $131_1$–$131_N$ to be constant with respect to temperature, the collector current $I_3$ must be constant with respect to temperature. However, as described below, the collector current $I_3$ is not constant with respect to temperature. The voltage across a PN semiconductor junction (diode) decreases as the temperature of the junction increases. Thus, as the temperature of bias circuit 101 increases, the (junction) voltages $V_{D1}$, $V_{BE1}$ and $V_{BE2}$ all decrease. As defined by Equation (6), as the voltages $V_{D1}$, $V_{BE1}$ and $V_{BE2}$ decrease, the collector current $I_3$ increases. As a result, the collector currents $I_{C1}$–$I_{CN}$ through transistors $131_1$–$131_N$ similarly increase. The increased collector currents through transistors $131_1$–$131_N$ undesirably change the operating characteristics of transmitter stage 102. More specifically, the increased collector currents in transistors $131_1$–$131_N$ can undesirably lower the power efficiency of transmitter power amplifier stage 102. Similarly, decreases in temperature will result in decreased collector currents through transistors $131_1$–$131_N$, thereby undesirably reducing the power gain of transmitter power amplifier stage 102.

Transmitter power amplifier circuit 100 is typically used in cellular telephone handsets, which are typically required to operate within an extreme range of temperatures (e.g., −30° C. to 85° C.). As the temperature changes, the operating characteristics of bias circuit 101 will change, such that the bias voltage for the transmitter circuit will vary, thereby resulting in considerable variations in the output power gain and power efficiency of the transmitter power amplifier circuit 100.

It would therefore be desirable to have a bias circuit for a power amplifier stage that is substantially independent of temperature. It would also be desirable to have a bias circuit for a power amplifier stage that allows for a selectable relationship between bias current and temperature.

SUMMARY

Accordingly, the present invention provides an improved bias circuit having a controlled temperature dependence. In one embodiment, the bias circuit includes a first bias circuit configured to provide a first current to a first node in response to a reference voltage ($V_{REF}$). The first current is directly related to the temperature of the bias circuit. Thus, as the temperature increases, the first current increases. In one embodiment, the first current is comprised of the combination of two currents flowing through parallel branches of the bias circuit.

A bias control circuit is configured to draw a control current from the first node in response to the reference voltage ($V_{REF}$). Like the first current, the control current is directly related to the temperature of the bias circuit.

A bias current, which is equal to the difference between the first current and the control current, is drawn from the first node. Because both the first current and the control current are directly related to temperature, the bias current can be made relatively insensitive to variations in temperature. That is, because an increase in temperature results in an increase in both the first current (into the first node) and the control current (out of the first node), the bias current remains relatively unchanged if the variations of the first current and the control current are matched. In other embodiments, the bias current can be controlled to increase or decrease with respect to an increasing temperature.

The bias circuit is further configured to provide a bias voltage ($V_{BIAS}$) on a second node in response to the reference voltage ($V_{REF}$). An amplifier stage can be coupled to the second node, such that a current proportional to the bias current flows in the amplifier stage in response to the bias voltage. The amplifier stage can be, for example, a portion of a cellular telephone wireless transmitter handset.

In accordance with one embodiment, the bias control circuit includes a first transistor having a collector coupled to the first node, and an emitter coupled to ground. A resistive element has a first terminal coupled to receive the reference voltage, and a second terminal coupled to a base of the first transistor. A second bipolar transistor has a collector coupled to the second terminal of the resistive element, an emitter coupled to ground, and a base coupled to the base of the first transistor. A diode element can be coupled between the second terminal of the resistive element and the collector of the second transistor to adjust the temperature sensitivity of the control current.

The present invention also includes a method that includes the steps of (1) generating a bias control current that increases as temperature increases, wherein the bias control current flows out of a first node of a bias circuit, (2) generating a first current that increases as temperature increases, wherein the first current is greater than the bias control current, and flows into the first node of the bias circuit, (3) providing a bias current from the first node of the bias circuit to a transistor of the bias circuit, wherein the bias current is equal to the difference between the first current and the bias control current.

The present invention will be more fully understood in view of the following description and drawings.

DETAILED DESCRIPTION

Figure 1:
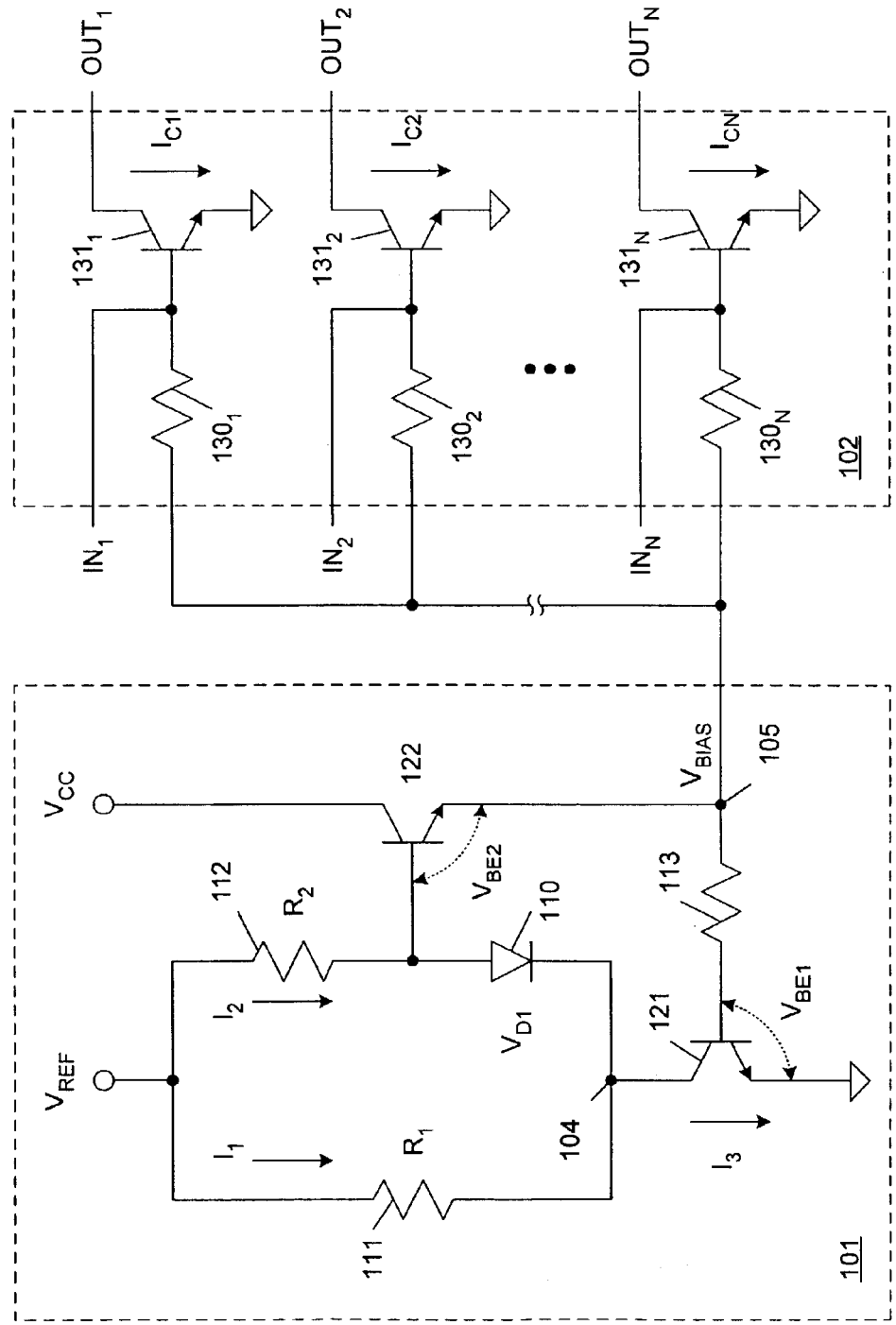
FIG. 1 is a circuit diagram of a portion of a conventional transmitter circuit, including a bias circuit and a transmitter amplifier stage.

Embodiments are described using NPN-type bipolar junction transistors (BJTs), which are illustrative of various transistor types that may be used in other embodiments of the invention. Some embodiments are formed on an integrated circuit chip having a gallium arsenide (GaAs) substrate, and use heterojunction BJTs (HBTs) for at least some transistors. Other embodiments are implemented using other types of semiconductor material technology. In the drawings, like-numbered or labeled elements represent the same or substantially similar elements. It should be understood that electrical components described as being coupled together are electrically coupled. It should also be understood that the scope of the enclosed invention includes embodiments in which additional electrical components may be coupled between elements described herein, and that such components are omitted from the description so as to more clearly illustrate the invention. The chassis ground symbols shown in the drawings are illustrative of various electrical grounds that may be used as a reference electrical potential.

Figure 2:
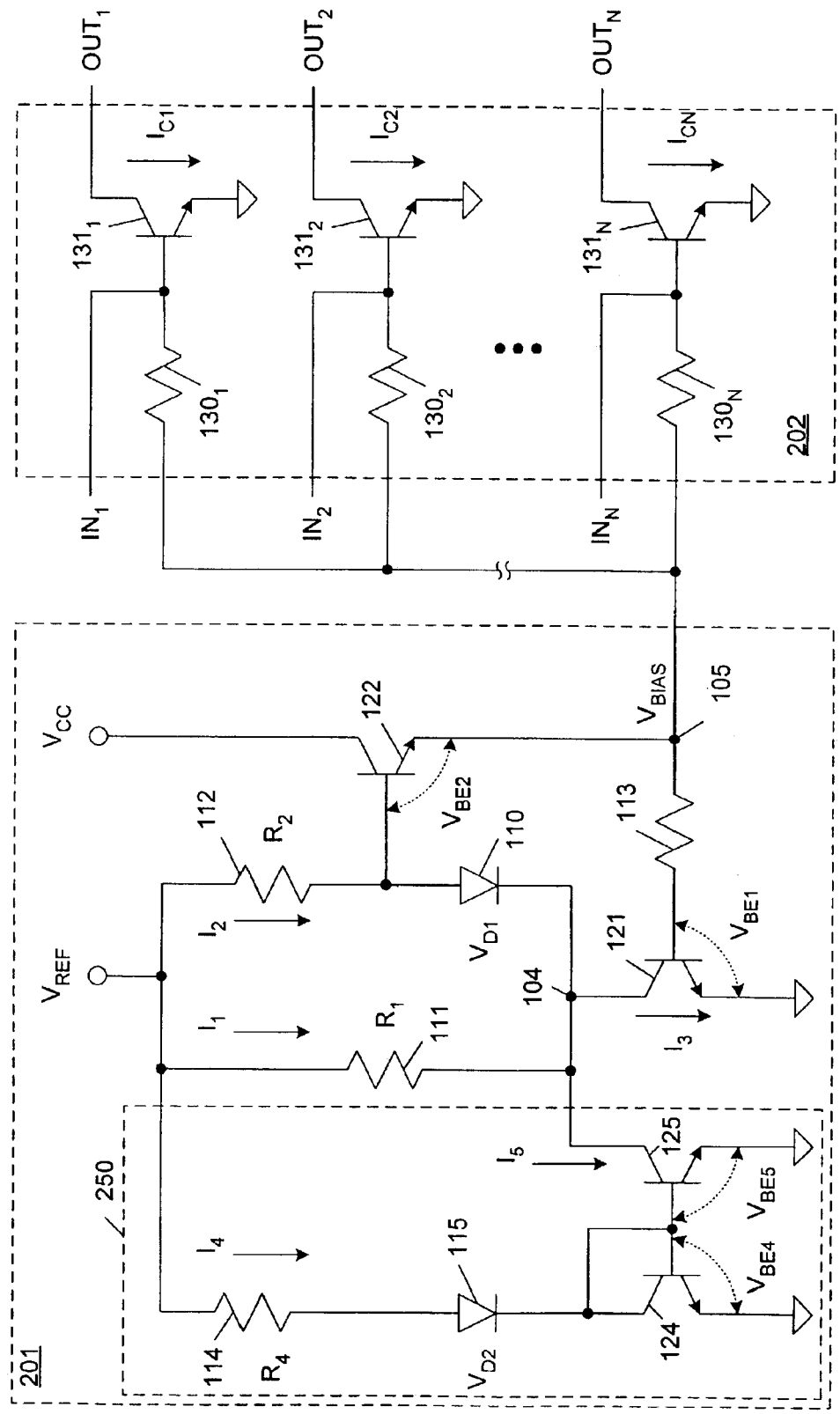
FIG. 2 is a circuit diagram of a portion of a transmitter circuit in accordance with one embodiment of the present invention.

FIG. 2 is a circuit diagram of a portion of a transmitter power amplifier circuit 200 in accordance with one embodiment of the present invention. Transmitter power amplifier circuit 200 includes bias circuit 201 and amplifier stage 202. Amplifier stage 202 can be, for example, a final amplifying stage in a wireless cellular telephone handset transmitter power amplifier integrated circuit. In another instance, amplifier stage 202 can be a driving stage in such an integrated circuit.

Because portions of transmitter power amplifier circuit 200 (FIG. 2) are similar to portions of transmitter circuit 100 (FIG. 1), similar elements in FIGS. 1 and 2 are labeled with similar reference numbers. Thus, amplifier circuit 202 includes bias resistors $130_1$, $130_2$, ... $130_N$, and associated NPN bipolar transistors $131_1$, $131_2$, ... $131_N$ (where N is an integer). Although the present example shows three or more pairs of bias resistors/bipolar transistors, it is understood that other numbers of resistor/transistor pairs can be used in amplifier circuit 102 in other embodiments.

Bias circuit 201 includes diode 110, resistors 111–113, NPN bipolar transistors 121–122 and nodes 104–105, which were described above in connection with FIG. 1. In addition, bias circuit 201 includes a bias control circuit 250, which includes resistor 114, diode 115 and NPN bipolar transistors 124 and 125. In one embodiment, diodes 110 and 115 are diode-connected transistors. The first terminal of resistor 114 is connected to reference voltage supply terminal ($V_{REF}$) and a second terminal of resistor 114 is coupled to the anode of diode 115. The cathode of diode 115 is coupled to the collector and base of transistor 124 and the base of transistor 125. The emitters of transistors 124 and 125 are coupled to the ground supply terminal. The collector of transistor 125 is coupled to node 104.

Bias circuit 201 operates in the following manner. Currents $I_1$ and $I_2$ are established in the manner defined above in Equations (5) and (2), respectively. Conceptually, these currents $I_1$ and $I_2$ form a first current that flows into node 104. Combined, these currents $I_1$ and $I_2$ exhibit a temperature dependence that is defined above in Equation (6).

Because the bases of transistors 124 and 125 are commonly coupled to the cathode of diode 115, and the emitters of transistors 124 and 125 are commonly coupled to the ground supply terminal, the base-to-emitter voltage $V_{BE4}$ of transistor 124 is equal to the base-to-emitter voltage $V_{BE5}$ of transistor 125. The collector current $I_4$ of transistor 124 is therefore directly proportional to the collector current $I_5$ of transistor 125. More specifically, if the emitter area of transistor 124 is equal to A4, and the emitter area of transistor 125 is equal to A5, then the collector currents $I_4$ and $I_5$ are related in the following manner.

$$I_5 = I_4 (A5/A4) \tag{7}$$

If the voltage drop across diode 115 is designated $V_{D2}$, then the voltage drop across resistor 114 ($V_{114}$) can be defined as follows.

$$V_{114} = V_{REF} - (V_{D2} + V_{BE4}) \tag{8}$$

If resistor 114 has a resistance of $R_4$, then collector current $I_4$ can be defined as follows.

$$I_4 = V_{114}/R_4 = (V_{REF} - (V_{D2} + V_{BE4}))/R_4 \tag{9}$$

Thus, the collector current $I_5$ through transistor 125 can be defined as follows.

$$I_5 = (A5/A4)(V_{REF} - (V_{D2} + V_{BE4}))/R_4 \tag{10}$$

Using Kirchoff's current law, the sum of the currents flowing into node 104 ($I_1$ and $I_2$) is equal to the sum of the currents flowing out of node 104 ($I_3$ and $I_5$). Thus, the relationship between currents $I_1$, $I_2$, $I_3$ and $I_5$ can be written as follows.

$$I_3 = I_1 + I_2 - I_5 \tag{11}$$

Substituting Equations (2), (5) and (10) into Equation (11) provides the following.

$$I_3 = (V_{REF} - (V_{BE1} + V_{BE2}))/R_2 + (V_{REF} - (V_{BE1} + V_{BE2}) + V_{D1})/R_1 - (A5/A4)(V_{REF} - (V_{D2} + V_{BE4}))/R_4 \tag{12}$$

As the temperature of bias circuit 201 increases, the (junction) voltages $V_{D1}$, $V_{D2}$, $V_{BE1}$, $V_{BE2}$ and $V_{BE4}$ all decrease. As a result, each of the currents $I_1$, $I_2$ and $I_5$ increases. However, because the increase in current $I_5$ is effectively subtracted from the increases in currents $I_1$ and $I_2$ (Equations 11–12), the current $I_3$ remains relatively constant as the temperature increases.

Conversely, as the temperature of bias circuit 201 decreases, the voltages $V_{D1}$, $V_{D2}$, $V_{BE1}$, $V_{BE2}$ and $V_{BE4}$ all increase. As a result, each of the currents $I_1$, $I_2$ and $I_5$ decreases. However, because the decrease in current $I_5$ is effectively subtracted from the decreases in currents $I_1$ and $I_2$ (Equations 11–12), the current $I_3$ remains relatively constant as the temperature decreases.

Stated another way, the collector current $I_5$ of transistor 125 increases as temperature increases. By controlling the magnitude of current $I_5$, the magnitude of current $I_3$ through transistor 121 is controlled. Skilled persons will understand that diode 115 provides a relatively high temperature dependence slope for current $I_5$. Skilled persons will also understand that diode 115 is illustrative of various embodiments in which one or more, or in one instance zero, diodes are used, depending on the magnitude of the reference voltage $V_{REF}$.

To make current $I_3$ temperature independent, the temperature dependence of current $I_5$ should be equal to the combined temperature dependences of currents $I_1$ and $I_2$. Further, to make current $I_3$ increase with temperature, the temperature dependence of current $I_5$ should be less than the combined temperature dependences of currents $I_1$ and $I_2$. Similarly, to make current $I_3$ decrease with temperature, the temperature dependence of current $I_5$ should be larger than the combined temperature dependences of currents $I_1$ and $I_2$.

The relationship between collector current $I_3$ and temperature can be selected by the circuit designer by appropriately selecting the resistances $R_1$–$R_4$, the emitter areas of transistors 121–125 and the junction areas of diodes 110 and 115. Table 1 below lists these parameters for one embodiment of the present invention.

TABLE 1

| Transistor/Diode | Emitter Area($\mu m^2$) |
|---|---|
| 121 | 405 |
| 122 | 2,430 |
| $131_1$-$131_N$ (N = 16) | 405 |
| 124 | 135 |
| 125 | 405 |
| 110 | 405 |
| 115 | 135 |

| Resistors | Resistance(Ohms) |
|---|---|
| 111 ($R_1$) | 300 |
| 112 ($R_2$) | 120 |
| 113 | 40 |
| $130_1$-$130_N$ (N = 16) | 125 |
| 114 ($R_4$) | 225 |

Figure 3:
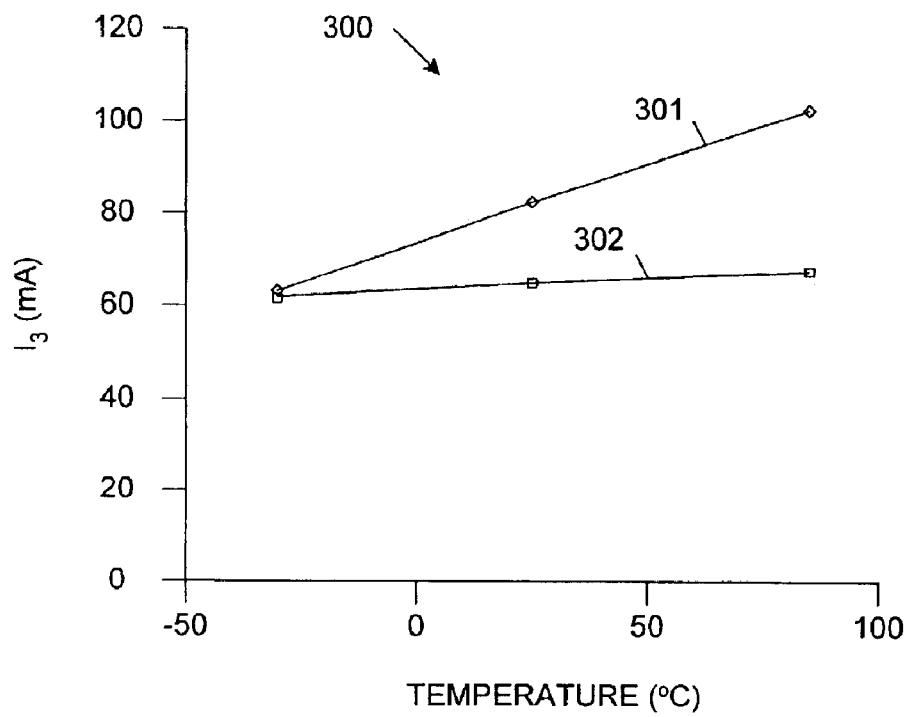
FIG. 3 is a graph that illustrates the relationship between quiescent collector current and temperature for the transmitter circuits of FIGS. 1 and 2.

FIG. 3 is a graph 300 showing the relationship between the measured quiescent collector current $I_3$ (milliamperes (mA)) versus temperature (° C.). Line 301, shown plotted by diamonds, represents the current/temperature relationship of bias circuit 101 of FIG. 1. As illustrated, the collector current $I_3$ of bias circuit 101 varies from about 63 mA at −30° C. to about 102 mA at 85° C. This variation represents an increase of about 62 percent over the expected temperature range of a cellular telephone. Line 302, shown plotted by squares, represents the current/temperature relationship of the bias circuit 201 of the present invention (FIG. 2). As illustrated, the collector current $I_3$ of bias circuit 201 varies from about 62 mA at −30° C. to about 68 mA at 85° C. This variation represents an increase of less than about 10 percent over the expected temperature range of a cellular telephone.

Figure 4:
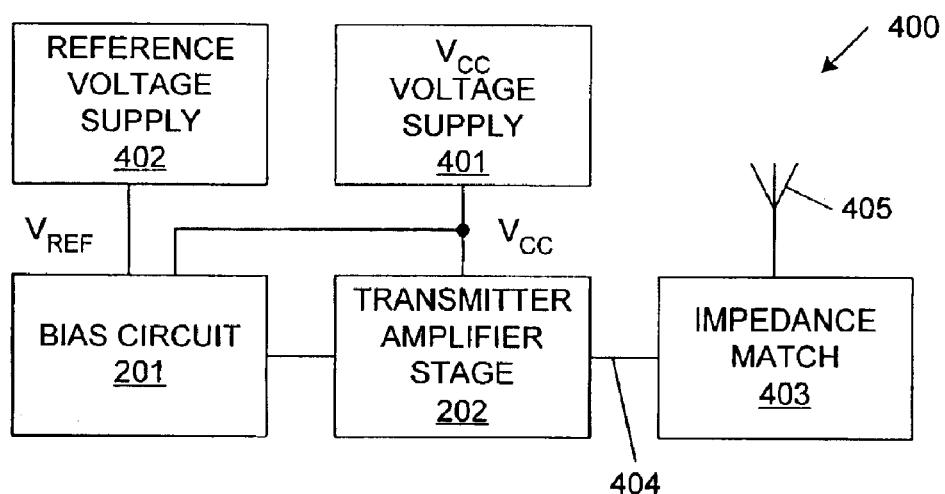
FIG. 4 is a block diagram of the output stage of a power amplifier in a cellular telephone handset in accordance with one embodiment of the present invention.

FIG. 4 is a block diagram of the output stage of a power amplifier in a cellular telephone handset 400 in accordance with one embodiment of the present invention. As shown in FIG. 4, amplifier stage 202 receives a temperature-stabilized base bias voltage ($V_{BIAS1}$) from bias circuit 201 as described above. Reference voltage supply 402 supplies reference voltage $V_{REF}$ to bias circuit 201, and power supply 401 supplies voltage $V_{CC}$ to bias circuit 201 and amplifier stage 202. Amplifier stage 202 outputs an amplified signal from the parallel-connected collector terminals of transistors $131_1$–$131_N$ (illustrated as output terminal 404). This amplified signal is transmitted to antenna 405 via conventional impedance matching circuit 403. Bias circuit 201 allows transmitter 400 to broadcast a signal having relatively constant power over an extreme range of anticipated operating temperatures.

Although the invention has been described in connection with several embodiments, it is understood that this invention is not limited to the embodiments disclosed, but is capable of various modifications, which would be apparent to one of ordinary skill in the art. For example, the circuit topology that includes resistor 114, diode 115, and transistors 124–125 may be used with other bias circuits that are temperature dependent. That is, this topology may be used to provide temperature dependent control for current exiting from a particular node. Thus, current for a particular device coupled at the node is controlled as a function of temperature. In addition, capacitors can be added to power amplifier circuit 200 to achieve the goals of RF bypass, RF decoupling and/or loop bandwidth adjustment. The connections and sizes of such capacitors would be obvious to those of ordinary skill in the art. Thus, the invention is limited only by the following claims.

We claim:

1. A circuit comprising:
    a first bias circuit configured to provide a first current to a first node in response to a reference voltage, and draw a first bias current from the first node, wherein the first current is directly related to a temperature of the circuit; and
    a bias control circuit configured to draw a first bias control current from the first node in response to the reference voltage, wherein the first bias control current is directly related to the temperature of the circuit wherein the bias control circuit comprises:
    a first transistor having a first power terminal coupled to the first node and a second power terminal coupled to ground;
    a resistive element having a first terminal coupled to receive the reference voltage, and a second terminal coupled to a control terminal of the first transistor; and
    a second transistor having a first power terminal coupled to the second terminal of the resistive element, a second power terminal coupled to ground, and a control terminal coupled to the control terminal of the first transistor.

2. The circuit of claim 1, wherein the first bias circuit is configured to provide a bias voltage on a second node in response to the reference voltage.

3. The circuit of claim 2, further comprising an amplifier stage coupled to the second node, wherein the amplifier stage is configured to introduce a current proportional to the first bias current in response to the first bias voltage.

4. The circuit of claim 3, wherein the amplifier stage is a portion of a cellular telephone wireless transmitter handset.

5. The circuit of claim 1, wherein the first bias control current exhibits a first variation with respect to temperature, and the first current exhibits a second variation with respect to temperature, wherein the first variation is approximately equal to the second variation.

6. The circuit of claim 5, wherein the first variation and the second variation cause the first bias current to be relatively constant with respect to temperature.

7. The circuit of claim 6, wherein the bias current varies 10 percent or less over a temperature range of 50° C.

8. The circuit of claim 1, wherein the first bias control current increases at a first rate as temperature increases, and wherein the first current increases at a second rate as temperature increases, wherein the first rate is greater than the second rate.

9. The circuit of claim 1, wherein the first bias control current increases at a first rate as temperature increases, and wherein the first current increases at second rate as temperature increases, wherein the first rate is less than the second rate.

10. The circuit of claim 1, further comprising a diode element coupled between the second terminal of the resistive element and the first power terminal of the second transistor.

11. The circuit of claim 1, wherein the first power terminal of the first transistor and the first power terminal of the second transistor are collector regions, the second power terminal of the first transistor and the second power terminal of the second transistor are emitter regions, and the control terminal of the first transistor and the control terminal of the second transistor are base regions.

12. The circuit of claim 1, wherein the first and second transistors are NPN bipolar transistors.

13. The circuit of claim 1, wherein the first and second transistors comprise gallium arsenide.

14. The circuit of claim 1, wherein the first and second transistors are heterojunction bipolar transistors.

15. The circuit of claim 1, wherein the first bias circuit comprises:
    a first resistor coupled between the first node and a reference voltage supply terminal for providing the reference voltage;
    a second resistor coupled between the reference voltage supply terminal and an intermediate node;
    a diode element coupled between the intermediate node and the first node;
    a third transistor having a first power terminal coupled to the first node and a second power terminal coupled to ground, wherein the bias current flows into the first power terminal of the third transistor;
    a third resistor having a first terminal coupled to a control terminal of the third transistor, and a second terminal that provides a bias voltage; and
    a fourth transistor having a first power terminal coupled to a first voltage supply terminal, a second power terminal coupled to the second terminal of the third resistor, and a control terminal coupled to the intermediate node.

* * * * *